US007456692B2

(12) United States Patent
Maruyama et al.

(10) Patent No.: US 7,456,692 B2
(45) Date of Patent: Nov. 25, 2008

(54) GAIN VARIABLE AMPLIFIER

(75) Inventors: Tatsuhiko Maruyama, Kanagawa (JP);
Naohiro Matsui, Kanagawa (JP)

(73) Assignee: NEC Electronics Corporation,
Kawasaki, Kanagawa (JP)

( * ) Notice: Subject to any disclaimer, the term of this patent is extended or adjusted under 35 U.S.C. 154(b) by 96 days.

(21) Appl. No.: 11/341,526

(22) Filed: Jan. 30, 2006

(65) Prior Publication Data

US 2006/0170497 A1   Aug. 3, 2006

(30) Foreign Application Priority Data

Jan. 31, 2005   (JP)   ............................. 2005-024130

(51) Int. Cl.
*H03F 1/22*   (2006.01)
*H03F 3/45*   (2006.01)

(52) U.S. Cl. ...................................... 330/295; 330/254

(58) Field of Classification Search ................. 330/254, 330/261

See application file for complete search history.

(56) References Cited

U.S. PATENT DOCUMENTS 6,259,901 B1 *   7/2001   Shinomiya et al. ........ 455/127.3
7,242,251 B2 *   7/2007   Boos ........................... 330/279

FOREIGN PATENT DOCUMENTS

JP       2002-16458       1/2002

* cited by examiner

*Primary Examiner*—Steven J Mottola
(74) *Attorney, Agent, or Firm*—McGinn IP Law Group, PLLC (57) ABSTRACT

A gain variable amplifier according to an embodiment of the present invention includes: an amplifier circuit amplifying an input signal with a variable gain; and a gain control circuit controlling the gain of the amplifier circuit based on a gain control signal, in which the amplifier circuit includes: an amplifying element amplifying the input signal; an output element series-connected with the amplifying element and outputting a signal amplified with the amplifying element; and a bias circuit changing a potential at a node between the output element and the amplifying element based on the gain control of the gain control circuit.

10 Claims, 7 Drawing Sheets

GAIN VARIABLE AMPLIFIER

BACKGROUND OF THE INVENTION

1. Field of the Invention

The present invention relates to a gain variable amplifier, in particular, a gain variable amplifier that varies a gain depending on a gain control signal.

2. Description of Related Art

In recent years, a gain variable amplifier (GCA) that amplifies a signal with an amplification degree corresponding to an input signal level has been adopted in the field of wireless communications. The gain variable amplifier stabilizes an output level by changing a gain of an amplifier even if an input signal level changes due to a state of a communication path etc. To that end, the gain variable amplifier is required to stably operate within a wide dynamic range (gain variation range) in which an output level can be stabilized even if an input signal level largely changes.

Figure 5:
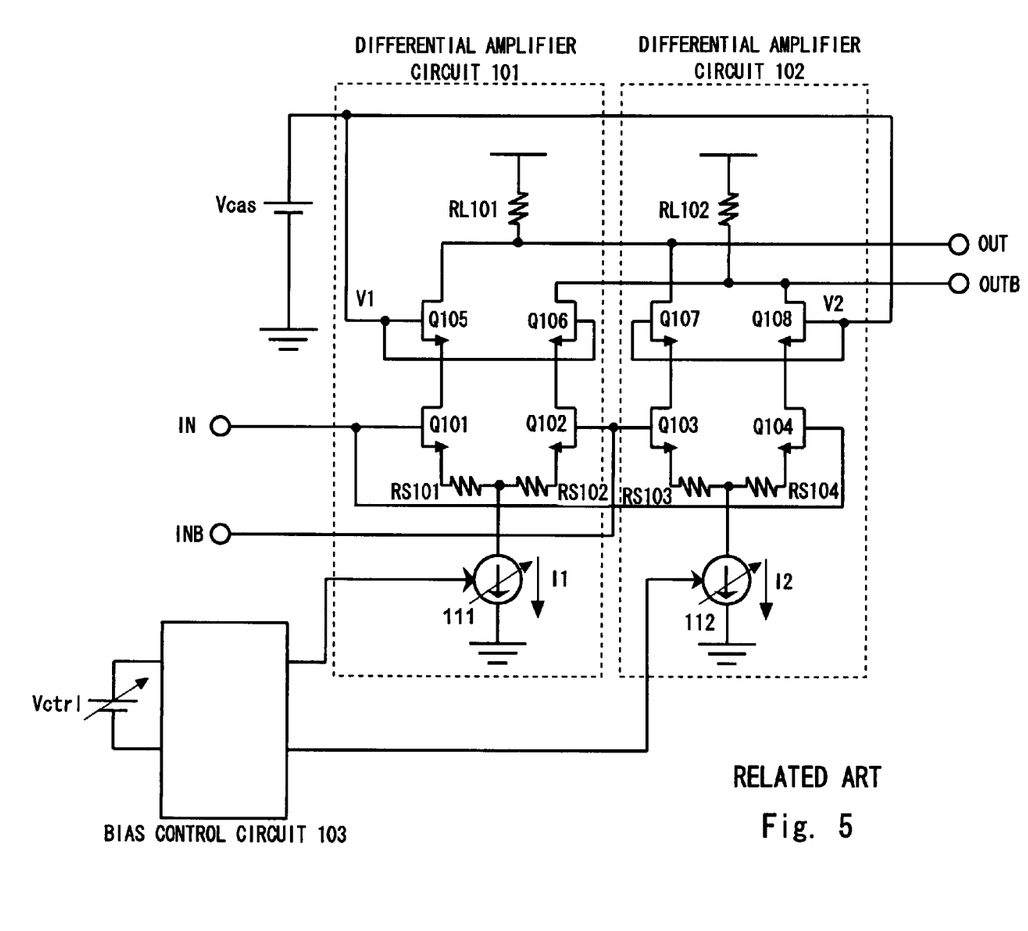
FIG. 5 is a circuit diagram showing the configuration of a conventional gain variable amplifier.

FIG. 5 is a circuit diagram showing the configuration of a conventional gain variable amplifier. As shown in FIG. 5, the conventional gain variable amplifier includes differential amplifier circuits 101 and 102, and a bias control circuit 103.

The differential amplifier circuit 101 includes transistors Q101 and Q102 as a differential pair. Transistors Q105 and Q106 are cascoded with drain terminals of the transistors Q101 and Q102, and source terminals of the transistors Q101 and Q102 are connected with one ends of feedback resistors Rs101 and Rs102. The other ends of the feedback resistors Rs101 and Rs102 are commonly connected with a variable power supply 111.

The differential amplifier circuit 102 includes transistors Q103 and Q104 as a differential pair similar to the differential amplifier circuit 101. Transistors Q107 and Q108 are cascoded with drain terminals of the transistors Q103 and Q104, and source terminals of the transistors Q103 and Q104 are connected with one ends of feedback resistors Rs103 and Rs104. The other ends of the feedback resistors Rs103 and Rs104 are commonly connected with a variable power supply 112. Drain terminals of the transistors Q105 and Q107 are commonly connected with a load resistor RL101 and an output terminal OUT, and drain terminals of the transistors Q106 and Q108 are commonly connected with a load resistor RL102 and an inverting output terminal OUTB.

Such a cascode amplifier circuit has been widely used. The cascoded transistors Q105 to Q108 function to increase an apparent conductance gm of the differential amplifier circuits 101 and 102, that is, increase an output impedance on the side of the output terminals OUT and OUTB. In the conventional gain variable amplifier, a constant voltage Vcas is applied to each gate of the cascoded transistors Q105 to Q108.

When an input signal is input to an input terminal IN, and an inverting input signal is input to an inverting input terminal INB, the transistors Q101 and Q104 amplify the input signal, and the transistors Q102 and Q103 amplify the inverting input signal. The signals amplified with the transistors Q101 and Q103 pass through the transistors Q105 and Q107, and then are added with the load resistor RL101 and output from the output terminal OUT. The signals amplified with the transistors Q102 and Q104 pass through the transistors Q106 and Q108, and then are added with the load resistor RL102 and output from the inverting output terminal OUTB.

Further, bias currents I1 and I2 of the variable power supplies 111 and 112 are kept at a current value corresponding to a control voltage Vctrl under the control of a bias control circuit 103. Owing to the bias currents I1 and I2, gain values of the differential amplifier circuits 101 and 102 continuously change. In other words, the gain values of the differential amplifier circuits 101 and 102 vary depending on the control voltage Vctrl, namely, the total gain of the conventional gain variable amplifier varies.

A desired gain value is obtained by setting the differential amplifier circuits 101 and 102 such that their gain values become different, and adjusting the bias currents I1 and I2. For example, the differential amplifier circuit 101 is set as a high-gain amplifier, while the differential amplifier circuit 102 is set as a low-gain amplifier. Then, in order to increase a gain, the differential amplifier circuit 101 is operated more than the circuit 102; in order to decrease a gain, the differential amplifier circuit 102 is operated more than the circuit 101.

Figure 6:
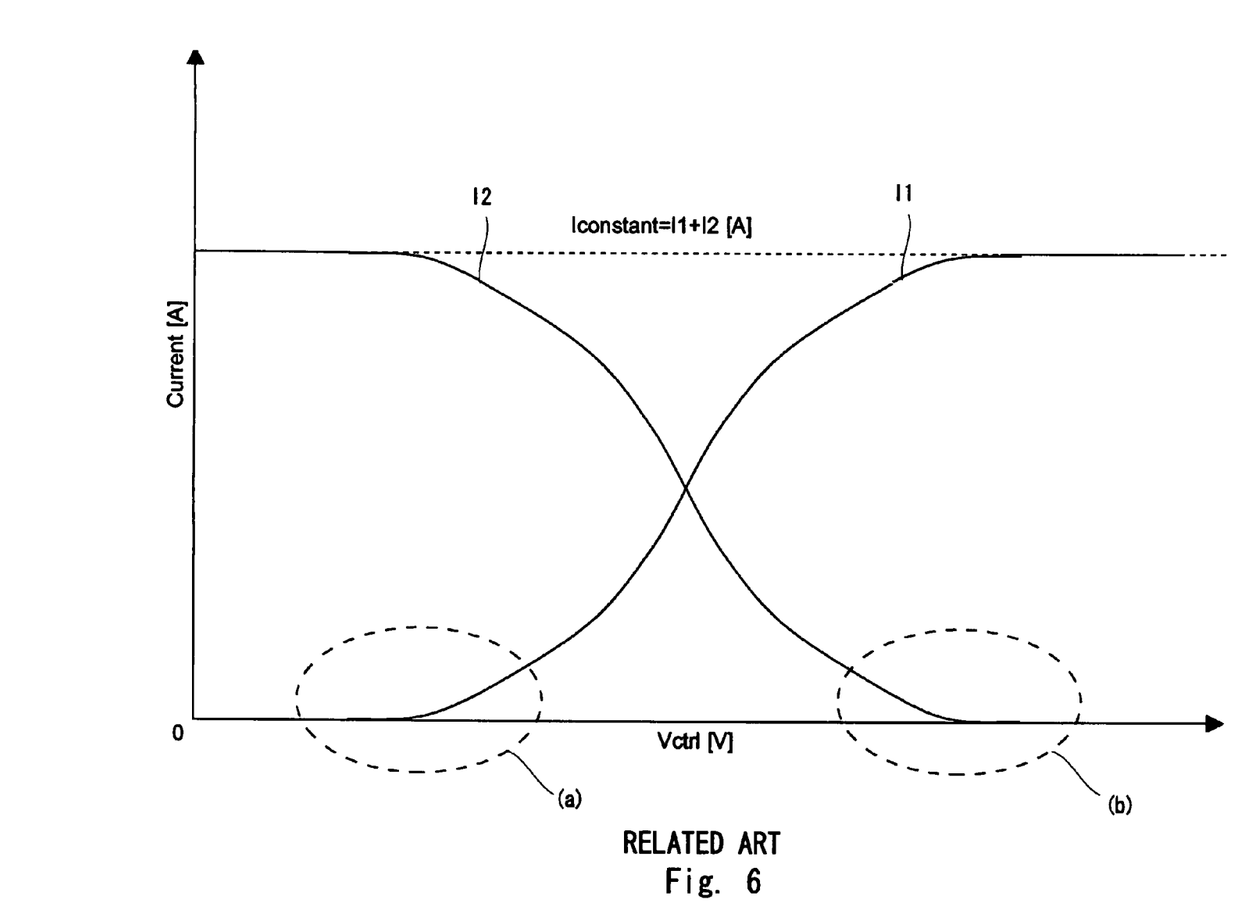
FIG. 6 is a graph showing a bias current characteristic of the conventional gain variable amplifier.

In this example, the circuit is controlled so that the bias currents I1 and I2 change as shown in FIG. 6. That, the bias control circuit 103 executes control such that the sum of the bias currents I1 and I2 is always constant (I1 +I2=Iconstant) even if the control voltage Vctrl is changed. The value of the control voltage Vctrl corresponds to the total gain of the gain variable amplifier.

If the control voltage Vctrl is low, the bias current I2 amount exceeds the bias current I1 amount. In this case, the bias current I2 is increased up to Iconstant, while the bias current I1 falls down to 0 as shown in a portion (a) of FIG. 6. Thus, the gain (low gain) of the differential amplifier circuit 102 corresponds to the total gain of the gain variable amplifier.

Incidentally, an amplifier disclosed in Japanese Unexamined Patent Publication No. 2002-16458 typifies the conventional gain variable amplifier.

However, the conventional gain variable amplifier of FIG. 5 has a problem in that a distortion characteristic is deteriorated.

Figure 7:
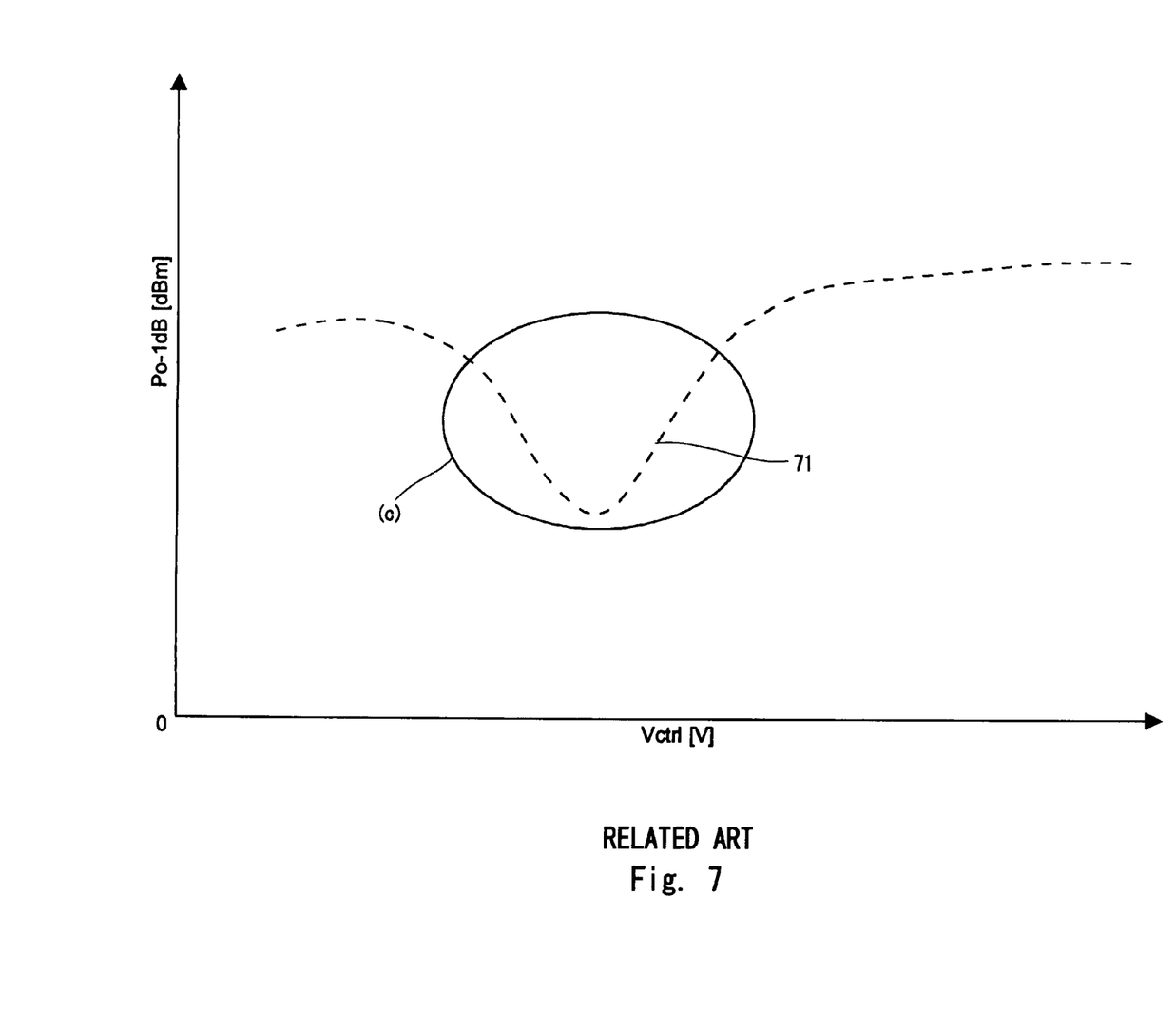
FIG. 7 is a graph showing an output power characteristic of the conventional gain variable amplifier.

FIG. 7 shows a characteristic of an output power relative to the control voltage Vctrl (Po-1dB characteristic) in the conventional gain variable amplifier. As shown in a portion (c) of FIG. 7, in the conventional gain variable amplifier, the output power characteristic cannot draw a straight line but draws a concave curve (that protrudes downward), which means deterioration of the distortion characteristic. The portion (c) of FIG. 7 corresponds to the portion (a) of FIG. 6, that is, the output power characteristic of the portion (c) is obtained when the bias current I1 falls down to around 0.

In the conventional gain variable amplifier, if the control voltage Vctrl is reduced in order to decrease a gain value of the gain variable amplifier, the bias current I1 flowing through the high-gain differential amplifier circuit 101 reduces. As a result, voltages across the feedback resistors Rs101 and Rs102 are lowered to reduce a source potential of the transistors Q101 and Q102. Here, a constant bias (Vcas) is applied to the transistors Q105, and Q106, so a drain potential of the transistors Q101 and Q102 is kept constant all the time. Therefore, along with the reduction in bias current I1, a drain-source voltage of the transistors Q101 and Q102 increases. In general, if the drain-source voltage increases, the transistor operates in a saturation region. For example, if drain-source voltage VDS>(gate-source voltage VGS-threshold voltage Vth), the transistor operates in a saturation region. Thus, if signals are input to the input terminal IN and the inverting input terminal INB, the transistors Q101 and Q102 operate in a saturation region. As a result, if a high-level signal is input (heavy input), the distortion characteristic deteriorates.

SUMMARY OF THE INVENTION

A gain variable amplifier according to an aspect of the present invention includes: an amplifier circuit amplifying an input signal with a variable gain; and a gain control circuit controlling the gain of the amplifier circuit based on a gain control signal, in which the amplifier circuit includes: an amplifying element amplifying the input signal; an output element series-connected with the amplifying element and outputting a signal amplified with the amplifying element; and a bias circuit changing a potential at a node between the output element and the amplifying element based on the gain control of the gain control circuit.

According to the gain variable amplifier, a potential at a node between an output element and an amplifying element (for example, MOSFET) is variable, whereby even during a low-gain operation, the amplifying element can operate not in a saturation region but a triode region. Consequently, it is possible to suppress deterioration of a distortion characteristic.

A gain variable amplifier according to another aspect of the invention includes: a differential amplifier circuit amplifying first and second input signals with a variable gain; and a gain control circuit controlling the gain of the differential amplifier circuit based on a gain control signal, in which the differential amplifier circuit includes: a first amplifying element amplifying the first input signal; a first cascoded element cascoded with the first amplifying element; a first cascoded element control circuit controlling the first cascoded element based on the gain control of the gain control circuit to change a potential at a first node between the first cascoded element and the first amplifying element; a second amplifying element amplifying the second input signal; a second cascoded element cascaded with the second amplifying element; and a second cascoded element control circuit controlling the second cascoded element based on the gain control of the gain control circuit to change a potential at a second node between the second cascoded element and the second amplifying element.

According to the gain variable amplifier, a potential at a node between a cascoded element and an amplifying element (for example, MOSFET) is variable, whereby even during a low-gain operation, the amplifying element can operate not in a saturation region but a triode region. Consequently, it is possible to suppress deterioration of a distortion characteristic.

A gain variable amplifier according to another aspect of the invention includes: a first differential amplifier circuit and a second differential amplifier circuit that amplify an input signal with a variable gain; and a gain control circuit controlling gains of the first differential amplifier circuit and the second differential amplifier circuit based on a gain control signal, in which the first differential amplifier circuit includes first differential-pair transistors that amplify the input signal, and a drain potential of the first differential-pair transistors is changed based on the gain control of the gain control circuit.

According to the gain variable amplifier, the drain potential of the differential-pair transistors is variable, whereby even during a low-gain operation, the amplifying element can operate not in a saturation region but a triode region. Consequently, it is possible to suppress deterioration of a distortion characteristic.

According to the present invention, it is possible to provide a gain variable amplifier that can suppress deterioration of a distortion characteristic.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
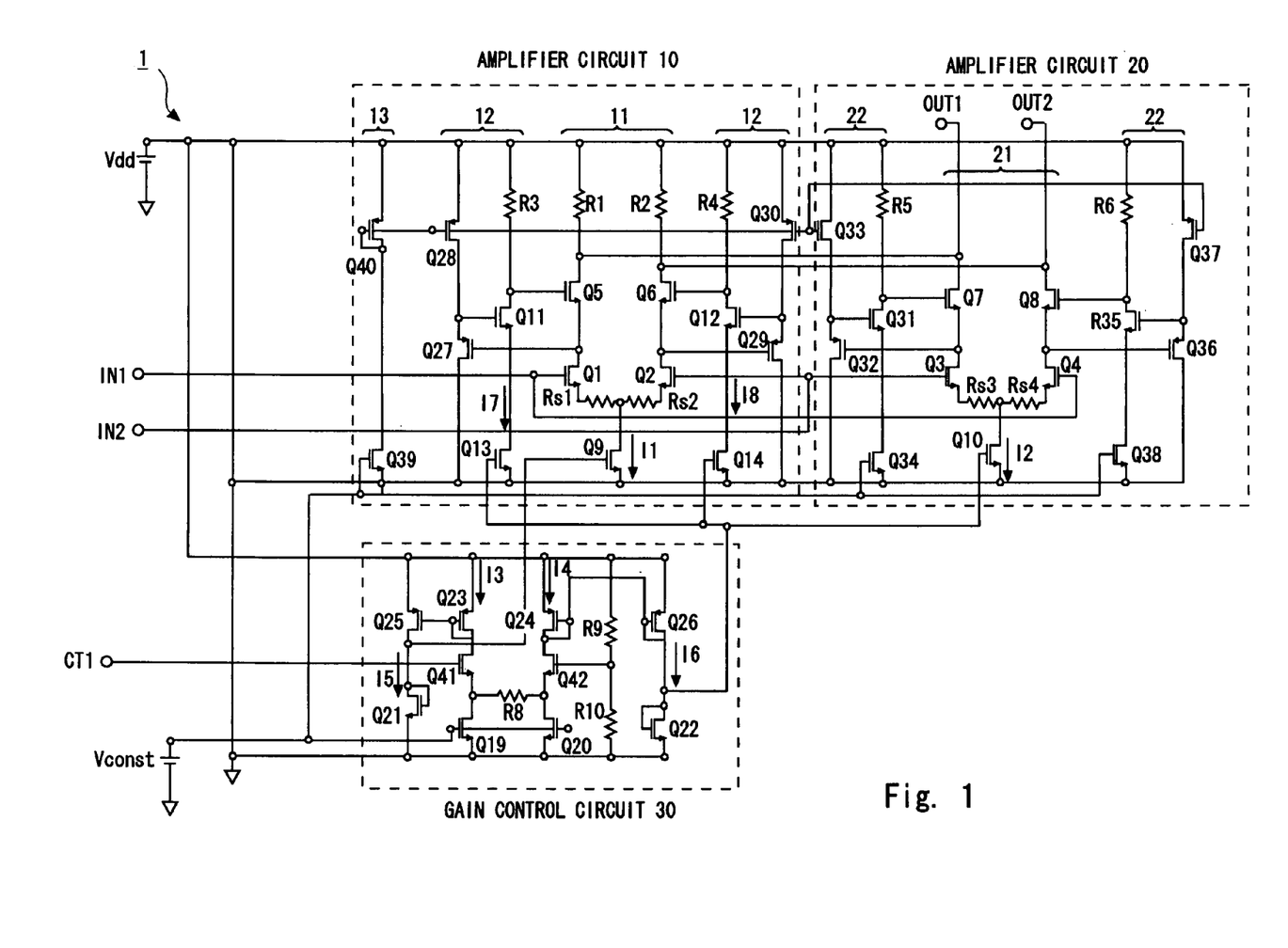
FIG. 1 is a circuit diagram showing the configuration of a gain variable amplifier according to a first embodiment of the present invention.

First, a gain variable amplifier according to a first embodiment of the present invention is described. The gain variable amplifier of this embodiment has a feature that a drain potential of a transistor for amplifying an input signal is changed in accordance with gain control.

Referring now to FIG. 1, the configuration of the gain variable amplifier of this embodiment is described. A gain variable amplifier 1 functions to make a gain variable depending on a control voltage Vctrl (gain control signal) from a gain control terminal CT1 to amplify input signals from input terminals IN1 and IN2 with the gain. For example, the control voltage Vctrl is changed in accordance with an input signal level, by which an output signal can be kept at a predetermined level.

As shown in FIG. 1, the gain variable amplifier 1 include amplifier circuits for amplifying input signals with varying gains, and a gain control circuit 30 for controlling gains of the amplifier circuits 10 and 20 based on the control voltage Vctrl.

The amplifier circuits 10 and 20 amplify an input signal and inverting input signal supplied to the input terminals IN1 and IN2 with a gain that is determined by the gain control circuit 30 to send the amplified output signal and inverting output signal to output terminals OUT1 and OUT2 by way of load resistors R1 and R2. For example, the load resistors R1 and R2 have the same resistance value.

The amplifier circuits 10 and 20 differ from each other in terms of a gain value (amplification degree) (under the same bias condition). If the amplifier circuits 10 and 20 have the same gain value, the circuits can operate normally. However, the different gain values enable a wider dynamic range. That is, a gain of one amplifier circuit becomes the maximum gain of the gain variable amplifier 1, and a gain of the other amplifier circuit becomes the minimum gain of the gain variable amplifier 1. In this example, a gain of the amplifier circuit 10 (high-gain amplifier) is higher than that of the amplifier circuit 20 (low-gain amplifier). Each gain of the amplifier circuits 10 and 20 is determined based on a size of each element, that is, a size of each of differential input transistors (Q1 to Q4) or feedback resistors (Rs1 to Rs4).

Hereinafter, the configuration of each circuit is described. Incidentally, transistors used in this example are N- or P-type MOSFETs (metal oxide semiconductor field effect transistors).

As shown in FIG. 1, the amplifier circuit 10 includes a differential amplifier 11 for differential-amplifying a differential signal (input signal and inverting input signal), a bias circuit 12 for supplying a predetermined bias voltage to the differential amplifier 11, and a reference voltage generating circuit 13 for supplying a predetermined reference voltage to the bias circuit 12 or the like.

The differential amplifier 11 amplifies the input signal and the inverting input signal based on a first control voltage (control voltage for controlling a bias current I1) from the gain control circuit 30, and a bias voltage from the bias circuit 12, respectively. As shown in FIG. 1, the differential amplifier 11 includes transistors Q1 and Q2, Q5, Q6, and Q9 as N-type MOSFETs, and feedback resistor Rs1 and Rs2. For example, the transistors Q1 and Q2, and the transistors Q5 and Q6 have similar characteristics, and the feedback resistors Rs1 and Rs2 have the same resistance value.

The transistors Q1 and Q2 are amplifying elements for amplifying an input signal and an inverting input signal, respectively. The transistors Q5 and Q6 are output elements for outputting signals amplified with the transistors Q1 and Q2, which are cascoded with the transistors Q1 and Q2. The term "cascode connection" means that a source-grounded amplifier circuit (transistors Q1 and Q2) and a gate-grounded amplifier circuit (transistors Q5 and Q6) are connected in tandem (cascoded). Due to the cascode connection, an input impedance can be increased by the source-grounded amplifier circuit on an input side, and an output impedance can be increased by the gate-grounded amplifier circuit on an output side (apparent conductance gm of the amplifier circuit 10 can be increased).

Further, the transistors Q5 and Q6 change drain potentials of the transistors Q1 and Q2 (potentials at nodes between the transistors Q1 and Q5 and between the transistors Q2 and Q6) in accordance with a bias voltage of the bias circuit 12. The transistor Q9 is a variable power supply (variable circuit) for changing a bias current I1 (current flowing through the transistors Q1 and Q2) in accordance with a first control voltage of the gain control circuit 30. The bias current I1 is changed to thereby change a gain of the differential amplifier 11.

The transistors Q1 and Q2 as a differential pair (differential-pair transistors or differential input transistors) have gates for receiving an input signal and an inverting input signal, respectively, and have drain terminals (one terminals) connected with source terminals of the transistors Q5 and Q6, respectively. That is, the transistors Q1 and Q2 are cascoded (series-connected in tandem) with the transistors Q5 and Q6. The transistors Q5 and Q6 have gates applied with the bias voltage of the bias circuit 12 and have drain terminals connected with a load resistor R1 and an output terminal OUT1, and a load resistor R2 and an output terminal OUT2, respectively. The feedback resistors Rs1 and Rs2 have one ends connected with source terminals (other terminals) of the transistors Q1 and Q2, and have other ends commonly connected with drain terminal of the transistor Q9. The transistor Q9 has a gate applied with the first control voltage of the gain control circuit 30, and has a grounded source.

The bias circuit 12 is a self-bias type bias circuit. The circuit 12 generates a bias voltage that varies depending on a second control voltage (control voltage for controlling a bias current I2) from the gain control circuit 30 and supplies the generated bias voltage to the transistors Q5 and Q6 of the differential amplifier 11. That is, the bias circuit 12 is also a cascoded element control circuit for controlling the transistors Q5 and Q6 in accordance with the second control voltage to change the drain potentials of the transistors Q1 and Q2. In this specification, the term "bias voltage" implies a voltage applied to the gates (control terminals) of the transistors Q5 and Q6 (cascoded elements).

As shown in FIG. 1, the bias circuit 12 includes resistors R3 and R4, transistors Q11 to Q14 as N-type MOSFETs, and transistors Q27 to Q30 as P-type MOSFETs. For example, the transistors Q11 and Q12, the transistors Q13 and Q14, the transistors Q27 and Q29, and the transistors Q28 and Q30 have similar characteristics, and the resistors R3 and R4 have the same resistance value.

In the bias circuit 12, a circuit (first bias circuit) for generating a bias voltage of the transistor Q5 includes the resistor R3, and the transistors Q11, Q13, Q27, and Q28, and a circuit (second bias circuit) for generating a bias voltage of the transistor Q6 includes the resistor R4, and the transistors Q12, Q14, Q29, and Q30. The transistors Q13 and Q14 are current sources for supplying currents (I7 and I8) corresponding to the second control voltage of the gain control circuit 30 to the resistors R3 and R4. The resistors R3 and R4 are circuits for converting (generating) the currents I7 and I8 into the gate voltages of the transistors Q5 and Q6. The transistors Q28 and Q30 are current sources for supplying a current corresponding to a reference voltage of the reference voltage generating circuit 13 to the transistors Q27 and Q29. The transistors Q11 and Q27, and the transistors Q12 and Q29 are circuits for controlling (adjusting) the gate voltages of the transistors Q5 and Q6 based on source potentials of the transistors Q5 and Q6.

In the first bias circuit connected with the transistor Q5, the resistor R3, and the transistors Q11 and Q13 that are connected in series (in tandem) are parallel-connected with the series-connected transistors Q28 and Q27. The resistor R3 has one end supplied with a power supply potential Vdd and the other end commonly connected with a drain of the transistor Q11 and a gate of the transistor Q5. The transistor Q13 has a drain connected with a source of the transistor Q11, a gate applied with the second control voltage of the gain control circuit 30, and a source grounded.

The transistor Q28 has a source applied with the power supply potential Vdd, a gate applied with the reference voltage of the reference voltage generating circuit 13, and a drain commonly connected with a source of the transistor Q27 and a gate of the transistor Q11. The transistor Q27 has a gate commonly connected with a source of the transistor Q5 and a drain of the transistor Q1, and a drain grounded.

In the second bias circuit connected with the transistor Q6, similar to the first bias circuit, the resistor R4, and the transistors Q12 and Q14 that are connected in series (in tandem) are parallel-connected with the series-connected transistors Q30 and Q29. Other elements are connected in a similar manner; the transistor Q14 has a gate applied with the second control voltage of the gain control circuit 30, and the transistor Q29 has a gate commonly connected with a source of the transistor Q6 and a drain of the transistor Q2.

The reference voltage generating circuit 13 generates a reference voltage based on a constant potential Vconst to supply the generated reference voltage to the transistors Q28 and Q30 of the bias circuit 12. In this example, the reference voltage generating circuit 13 is shared between the amplifier circuit 10 and the amplifier circuit 20, and the reference voltage of the reference voltage generating circuit 13 is applied to the bias circuit 22 (transistors Q33 and Q37) as well. Incidentally, two reference voltage generating circuits 13 may be provided for each of the amplifier circuit 10 and the amplifier circuit 20 to generate different reference voltages.

As shown in FIG. 1, the reference voltage generating circuit 13 includes a transistor Q40 as a P-type MOSFET and a transistor Q39 as an N-type MOSFET. The transistors Q40 and Q39 are connected in series (in tandem). The transistor Q40 has a source applied with the power supply potential Vdd and a gate commonly connected with its gate and a drain of the transistor Q39. Further, the transistor Q40 has a gate connected with each gate of the transistors Q28, Q30, Q33, and Q37. The transistor Q39 has a gate applied with a constant potential Vconst and a source grounded.

The amplifier circuit 20 includes a differential amplifier 21 and a bias circuit 22. Each component is the same as those of the amplifier circuit 10 and thus described in brief.

The differential amplifier 21 amplifies and outputs an input signal and an inverting input signal in accordance with a second control voltage (control voltage for controlling the bias current I2) from the gain control circuit 30 and a bias voltage from the bias circuit 22. The differential amplifier 21 includes the transistors Q3, Q4, Q7, Q8, and Q10 as N-type MOSFETs, and feedback resistors Rs3 and Rs4. The transistors Q3 and Q4 are amplifying elements, and the transistors Q7 and Q8 are cascoded elements. The transistor Q10 is a variable power supply for changing a bias current I2 (current flowing through the transistors Q3 and Q4) in accordance with the second control voltage of the gain control circuit 30.

The bias circuit 22 has the same configuration as the bias circuit 12, but in this example, the bias circuit 22 generates a predetermined bias voltage based on the constant potential Vconst to supply the generated bias voltage to the transistors Q7 and Q8. The bias circuit 22 includes resistors R5 and R6, transistors Q31, Q34, Q35, and Q38 as N-type MOSFETs, and transistors Q32, Q33, Q36, and Q37 as P-type MOSFETs. The transistors Q34 and Q38 are current sources for supplying a predetermined amount of current corresponding to the constant potential Vconst to the resistors R5 and R6. The resistors R5 and R6 are circuits for generating (converting the current into) a gate voltage of the transistors Q7 and Q8. The transistors Q33 and Q37 are current sources for supplying a current corresponding to a reference voltage of the reference voltage generating circuit 13 to the transistors Q32 and Q36. The transistors Q31 and Q32, and the transistors Q35 and Q36 are circuits for controlling (adjusting) the gate voltage of the transistors Q7 and Q8 based on source potentials of the transistors Q7 and Q8. Incidentally, the bias circuit 22 functions to generate a predetermined bias voltage and thus may be omitted. Instead, the predetermined voltage may be directly applied to the gates of the transistors Q7 and Q8.

The gain control circuit 30 outputs the first and second control voltages for controlling gains of the amplifier circuits 10 and 20 in accordance with a control voltage Vctrl applied to the gain control terminal CT1. The first control voltage is a control voltage for controlling the bias current I1 that is generated with the transistor Q9. The second control voltage is a control voltage for controlling the bias current I2 that is generated with the transistor Q10. As in the illustrated example of FIG. 6, the gain control circuit 30 executes control such that the sum of bias currents I1 and I2 is kept at a predetermined level even if the control voltage Vctrl is changed.

Further, in this embodiment, the first control voltage is used for controlling a gain of the differential amplifier 11 and the second control voltage is used for controlling a gain of the differential amplifier 21, and besides, the second control voltage is further used for controlling a bias voltage of the bias circuit 12. Here, the gain control circuit 30 has only to supply an appropriate bias voltage to the transistors Q9, Q10, Q13, and Q14 as in the example of FIG. 6, and the present invention is not limited to this circuit configuration.

The gain control circuit 30 includes transistors Q19 to Q22, Q41, and Q42 as N-type MOSFETs, transistors Q23 to Q26 as P-type MOSFETs, and resistors R8 to R10. For example, the transistors Q19 and Q20, transistors Q21 and Q22, transistors Q23 and Q24, transistors Q25 and Q26, and transistors Q41 and Q42 have the same characteristics.

In the gain control circuit 30, a circuit for generating the first control voltage (first control voltage generating circuit) includes the transistors Q19, Q21, Q23, Q25, and Q41, and a circuit for generating the second control voltage (second control voltage generating circuit) includes the transistors Q20, Q22, Q24, Q26, and Q42, and the resistors R9 and R10.

In the first control voltage generating circuit, the transistors Q23, Q41, and Q19 connected in series (in tandem) are parallel-connected with the series-connected transistors Q25 and Q21.

The transistor Q23 has a source applied with the power supply potential Vdd, and a gate commonly connected with its drain and a drain of the transistor Q41. The transistor Q41 has a gate applied with the control voltage Vctrl, and a source commonly connected with one end of the resistor R8 and a drain of the transistor Q19. The transistor Q19 has a gate applied with a constant potential Vconst, and a source grounded.

The transistor Q25 has a source applied with the power supply potential Vdd, and a gate commonly connected with a gate of the transistor Q23 and a drain of the transistor Q23. That is, the transistors Q23 and Q25 constitute a current mirror circuit. The transistor Q21 has a drain and gate connected together, and a source grounded. The drain or gate of the transistor Q21 serves as an output terminal for outputting the first control voltage and is connected with the gate of the transistor Q9. In other words, the transistors Q21 and Q9 constitute a current mirror circuit.

In the second control voltage generating circuit, the transistors Q24, Q42, and Q20 connected in series (in tandem), the series-connected resistors R9 and R10, and the series-connected transistors Q26 and Q22 are connected in parallel.

The transistor Q24 has a source applied with the power supply potential Vdd, and a gate commonly connected with its gate and a drain of the transistor Q42. The transistor Q42 has a gate applied with a voltage divided with the resistors R9 and R10, and a source commonly connected with the other end of the resistor R8 and a drain of the transistor Q20. The transistor Q20 has a gate applied with the constant potential Vconst, and a source grounded.

The resistor R9 has one end applied with the power supply potential Vdd, and the other end commonly connected with one end of the resistor R10 and a gate of the transistor Q42. The other end of the resistor R10 is grounded.

The transistor Q26 has a source applied with the power supply potential Vdd, and a gate commonly connected with a gate of the transistor Q24 and a drain of the transistor Q24. That is, the transistors Q24 and Q26 constitute a current mirror circuit. The transistor Q22 has a drain and gate connected together, and a source grounded. Further, the drain or gate of the transistor Q22 serves as an output terminal for outputting the second control voltage and is connected with the gates of the transistors Q13, Q14, and Q10. In short, the transistor Q22, and the transistors Q13, Q14, and Q10 constitute a current mirror circuit.

From now on, the operation of the gain variable amplifier 1 is described. First, in the gain variable amplifier 1, the gain control circuit 30 sets gains of the amplifier circuits 10 and 20 based on the control voltage Vctrl.

In the gain control circuit 30, the transistors Q19 and Q20 have the same characteristics and have gates commonly applied with the constant potential Vconst, and thus generate a constant current all the time. Therefore, the sum of current I3 flowing through the transistor Q23 and current I4 flowing through the transistor Q24 equals the constant current generated by the transistors Q19 and Q20. For example, provided that the control voltage Vctrl from the gain control terminal CT1 is equal to the voltage divided by the resistors R9 and R10, I3=I4. Provided that the control voltage Vctrl is higher than the divided voltage, I3>I4. Provided that the control voltage Vctrl is lower than the divided voltage, I3<I4. In any case, the sum of the currents I3 and I4 is uniform.

The transistors Q23 and Q25, and the transistors Q24 and Q26 constitute a current mirror circuit. Hence, the transistors Q25 and Q26 generate currents I5 and I6 in accordance with a mirror ratio of the currents I5 and I6 to the currents I3 and I4 to supply the generated currents to the transistors Q21 and Q22. The transistors Q23 and Q24, and the transistors Q25 and Q26 have the same characteristics, and the sum of the currents I3 and I4 is uniform, so the sum of the currents I5 and I6 is kept constant.

Further, the transistors Q21 and Q9, and transistors Q22 and Q10 constitute a current mirror circuit. Hence, the transistors Q9 and Q10 generate the currents I1 and I2 in accordance with a mirror ratio of the currents I1 and I2 to the currents I5 and I6 to supply the generated currents to the transistors Q1 and Q2, and the transistors Q3 and Q4. The transistors Q21 and Q22 have the same characteristics and the sum of the currents I5 and I6 is uniform, so the sum of the currents I1 and I2 is kept constant.

That is, the bias currents I1 and I2 are set so as to meet the relation of I5/I6=I1/I2. The higher the voltage Vctrl, the larger the value of I3/I4 and the larger the value of I5/I6. As a result, a value of I1/I2 is increased.

Then, in the gain variable amplifier 1, the amplifier circuits 10 and 20 execute amplification with the preset gains.

The amplifier circuits 10 and 20 amplify an input signal and an inverting input signal from the input terminals IN1 and IN2, and then the signals are added with the load resistor R1 and output as an output signal from the output terminal OUT1, and the signals are added with the load resistor R2 and output as an inverting output signal from the output terminal OUT2.

Since the amplifier circuit 10 is a high-gain amplifier, and the amplifier circuit 20 is a low-gain amplifier, as in the example of FIG. 6, the gain control circuit 30 executes control such that the proportion of the bias current I1 in the total current is increased for increasing a gain of the gain variable amplifier 1, and the proportion of the bias current I2 is increased for reducing a gain of the gain variable amplifier 1. The higher the proportion of the bias current I1, the more the amplifier circuit 10 executes an amplifying operation. This leads to a higher gain of the gain variable amplifier 1. The higher the proportion of the bias current I2, the more the amplifier circuit 20 executes an amplifying operation. This leads to a lower gain of the gain variable amplifier 1. Herein, the description is focused on the amplifier circuit 10, but the same operational principle applies to the amplifier circuit 20.

The cascoded transistors Q5 and Q6, and Q7 and Q8 increase the apparent conductance gm of the transistors Q1 and Q2, and Q3 and Q4, so the gains of the amplifier circuits 10 and 20 approximate R1/Rs1 and R1/Rs3.

That is, a voltage gain G of the gain variable amplifier 1 is derived from the following expression:

$$G \approx (R1/Rs1)*I1/(I1+I2)+(R1/Rs3)*I2/(I1+I2)$$

where Rs1>Rs3, Rs1=Rs2, Rs3=Rs4, and R1=R2, and the transistors Q1 and Q2, the transistors Q3 and Q4, the transistors Q5 and Q6, and the transistors Q7 and Q8 have the same characteristics.

For example, the maximum gain is obtained when the bias current I1 equals the current Iconstant, and the gain is G≈(R1/Rs1). The minimum gain is obtained when the bias current I2 equals the current Iconstant, and the gain is G≈(R1/Rs3).

Further, in the gain variable amplifier 1 of this embodiment, the bias voltage of the differential amplifier 11 is set under the gain control of the gain control circuit 30.

The bias circuit 12 of the amplifier circuit 10 determines a drain voltage and gate voltage of the transistors Q5 and Q6. The transistors Q13 and Q14 have gates applied with a voltage corresponding to the control voltage Vctrl (second control voltage) by the gain control circuit 30. As described above, the second control voltage is set higher for the lower control voltage Vctrl (i.e., lower gain). If the gate voltage of the transistors Q13 and Q14 is lowered, the currents I7 and I8 increase. As a result, a voltage drop becomes more significant at the resistors R3 and R4, and the gate voltage of the transistors Q5 and Q6 is lowered, so the drain potentials of the transistors Q1 and Q2 are lowered.

Further, in this embodiment, the transistors Q11 and Q27, and the transistors Q12 and Q29 execute control such that the transistors Q5 and Q6 carry out a desired operation (such as setting the drain potentials of the transistors Q1 and Q2 or output impedance to a predetermined value) even if the currents I7 and I8 increase to some extent. For example, if the drain potentials of the transistors Q1 and Q2 (source potentials of the transistors Q5 and Q6) are lowered, the current flowing through the transistors Q27 and Q29 increase. As a result, the gate voltage of the transistors Q11 and Q12 drops to increase the gate voltage of the transistors Q5 and Q6. Thus, the gate voltage of the transistors Q5 and Q6 is stabilized to secure the stable operation of the transistors Q5 and Q6.

On the other hand, in the case of low gains, the gain control circuit 30 applies a lower first control voltage to the transistor Q9 to reduce the current I1, and thus the voltage drops at the feedback resistors Rs1 and Rs2, and the source potentials of the transistors Q1 and Q2 are lowered.

Accordingly, the drain potentials of the transistors Q1 and Q2 are lowered in accordance with the second control voltage, and the source potentials of the transistors Q1 and Q2 are lowered in accordance with the first control voltage, so the drain-source voltage of the transistors Q1 and Q2 becomes low. In general, when the drain-source voltage is lowered, the transistor operates in a triode region (non-saturation region) Thus, if signals are input to the input terminals IN and INB in this case, the transistors Q1 and Q2 operate in the triode region. As a result, even if a high-level signal is input (forced input), the output signal is free from distortion to improve the distortion characteristic. For example, the transistors Q1 and Q2 operate in the triode region within such a range that drain-source voltage VDS<<(gate-source voltage VGS-threshold voltage Vth).

Figure 2:
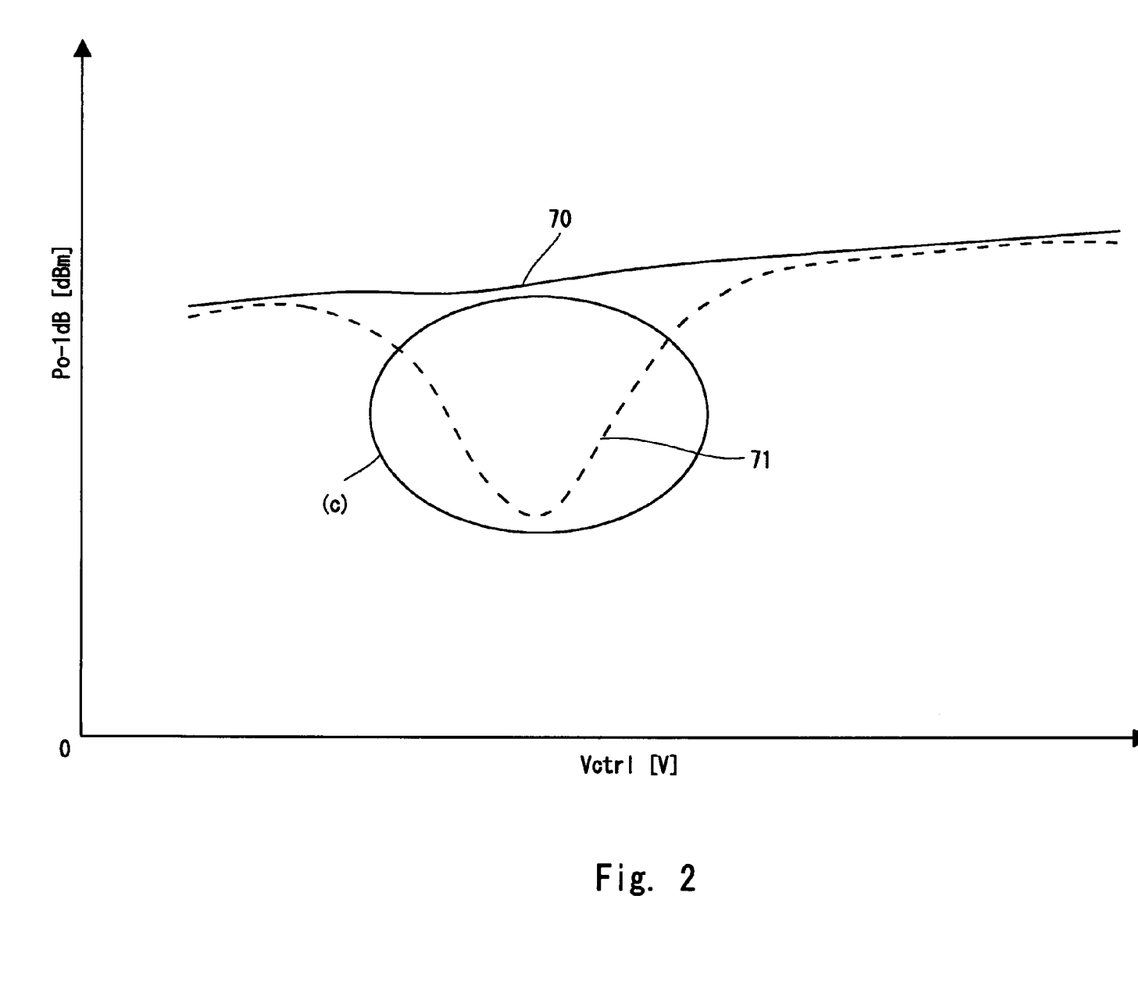
FIG. 2 is a graph showing an output power characteristic of the gain variable amplifier according to the first embodiment of the present invention.

FIG. 2 shows characteristics of an output power relative to the control voltage Vctrl (Po-1dB characteristic) in the gain variable amplifier of this embodiment. In FIG. 2, the line 70 shows characteristics of the gain variable amplifier of this embodiment, and the line 71 shows characteristics of a conventional gain variable amplifier. As shown in a portion (c) of FIG. 2, in the conventional gain variable amplifier, the output power characteristic cannot draw a straight line, which means the deterioration in distortion characteristic. However, in the gain variable amplifier of this embodiment, the output power characteristic draws almost the straight line, which means that the distortion characteristic improves.

Incidentally, in the amplifier circuit 20 as well, if the bias current I2 is reduced, the distortion characteristic is deteriorated. However, when the bias current I2 amount is small, as understood from the relation of FIG. 6, the bias current I1 amount is large, and the gain of the amplifier circuit 10 is high, so the output from the amplifier circuit 10 predominates over the output from the amplifier circuit 20 to minimize an influence of the distortion characteristic of the amplifier circuit 20. Therefore, in this embodiment, a constant voltage can be applied regardless of the gains of the transistors Q34 and Q38 of the amplifier circuit 20.

As mentioned above, in this embodiment, the source-drain voltage of the transistor is reduced within such an operational range that the bias current is diminished and the distortion characteristic of the differential input transistor is deteriorated. The bias voltage of the differential input transistor is set such that VDS<<(VGS-Vth) to thereby cause the transistor to operate in the triode range. Hence, the amplifying function of the transistor is weakened, so the distortion characteristic improves, and the circuit is resistant to the distortion even upon the forced input. Further, the distortion characteristic is improved at the time of low-gain operation, making it possible to secure a wide dynamic range of amplification degree and reduce the number of amplifier circuits, which contributes to power saving.

Second Embodiment

Figure 3:
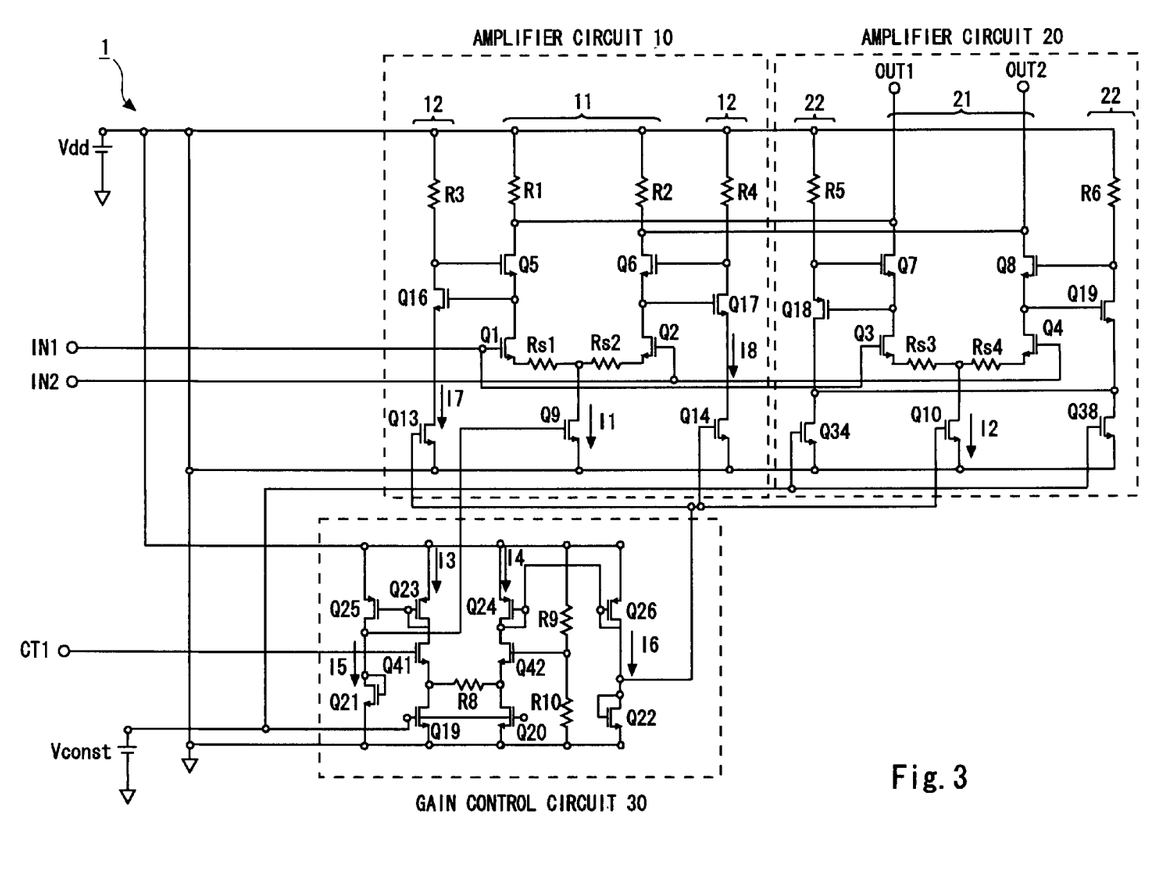
FIG. 3 is a circuit diagram showing the configuration of a gain variable amplifier according to a second embodiment of the present invention.

Next, a gain variable amplifier according to a second embodiment of the present invention is described. A feature of the gain variable amplifier of this embodiment resides in a simpler configuration of the bias circuit.

FIG. 3 is a circuit diagram showing the configuration of the gain variable amplifier of this embodiment. The basic configuration of the gain variable amplifier 1 is the same as that of FIG. 1. In FIG. 3, the same components as those of FIG. 3 are denoted by like reference numerals, and their description is omitted if not necessary.

The gain variable amplifier 1 of this embodiment differs from that of FIG. 1 in terms of the configuration of the bias circuits 12 and 22 of the amplifier circuits 10 and 20 and in that the reference voltage generating circuit 13 is omitted.

As shown in FIG. 3, the bias circuit 12 includes the resistors R3 and R4, and the transistors Q13, Q14, Q16, and Q17 as N-type MOSFETs. For example, the transistors Q16 and Q17 have the same characteristics. That is, the transistor Q16 is provided instead of the transistors Q11, Q27, and Q28 of FIG. 1, and the transistor Q17 is provided instead of the transistors Q12, Q29, and Q30 of FIG. 1. The transistors Q16 and Q17 are circuits for controlling (adjusting) the gate voltage of the transistors Q5 and Q6 in accordance with the source potentials of the transistors Q5 and Q6.

The transistor Q16 has a drain commonly connected with the other end of the resistor R3 and the gate of the transistor Q5, has a gate commonly connected with the source of the transistor Q5 and the drain of the transistor Q1, and has a drain connected with the drain of the transistor Q13. Likewise, the transistor Q17 has a drain commonly connected with the other end of the resistor R4 and the gate of the transistor Q6, has a gate commonly connected with the source of the transistor Q6 and the drain of the transistor Q2, and has a drain connected with the drain of the transistor Q14.

Likewise, the bias circuit 22 includes the resistors R5 and R6, and the transistors Q18, Q19, Q34, and Q38 as N-type MOSFETs. The transistor Q18 is provided in place of the transistors Q31, Q32, and Q33 of FIG. 1, and the transistor Q19 is provided in place of the transistors Q35, Q36, and Q37 of FIG. 1.

The operations of the amplifier circuits 10 and 20 are the same as those of FIG. 1. If the control voltage Vctrl is lowered, the second control voltage from the gain control circuit 30 increases to increase the currents I7 and I8, and the transistors Q5 and Q6 reduce the drain potentials of the transistors Q1 and Q2. Therefore, the drain-source voltage of the transistors Q1 and Q2 is lowered to cause the transistors Q1 and Q2 to operate in the triode region.

Further, in this embodiment, if the drain potentials of the transistors Q1 and Q2 (source potentials of the transistors Q5 and Q6) are lowered, the current flowing through the transistors Q16 and Q17 is diminished, so the gate voltage of the transistors Q5 and Q6 increases. In this way, the transistors Q16 and Q17 stabilize the gate voltage of the transistors Q5 and Q6 to secure the stable operation of the transistors Q5 and Q6.

As described above, in this embodiment, the bias circuit 12 is constituted of six elements, that is, the resistors R3 and R4, and the transistors Q13, Q14, Q16, and Q17. Thus, the bias circuit 12 can be configured with almost ½ of the elements of the first embodiment. Similarly, the bias circuit 22 is constituted of six elements, that is, the resistors R5 and R6, and the transistors Q34, Q38, Q18, and Q19. Thus, the bias circuit 12 can be configured with almost ½ of the elements of the first embodiment. Moreover, in this embodiment, the reference voltage generating circuit 13 is unnecessary. Therefore, the gain variable amplifier of this embodiment can save a circuit area and reduce a noise generated from each element as compared with the first embodiment.

Third Embodiment

Figure 4:
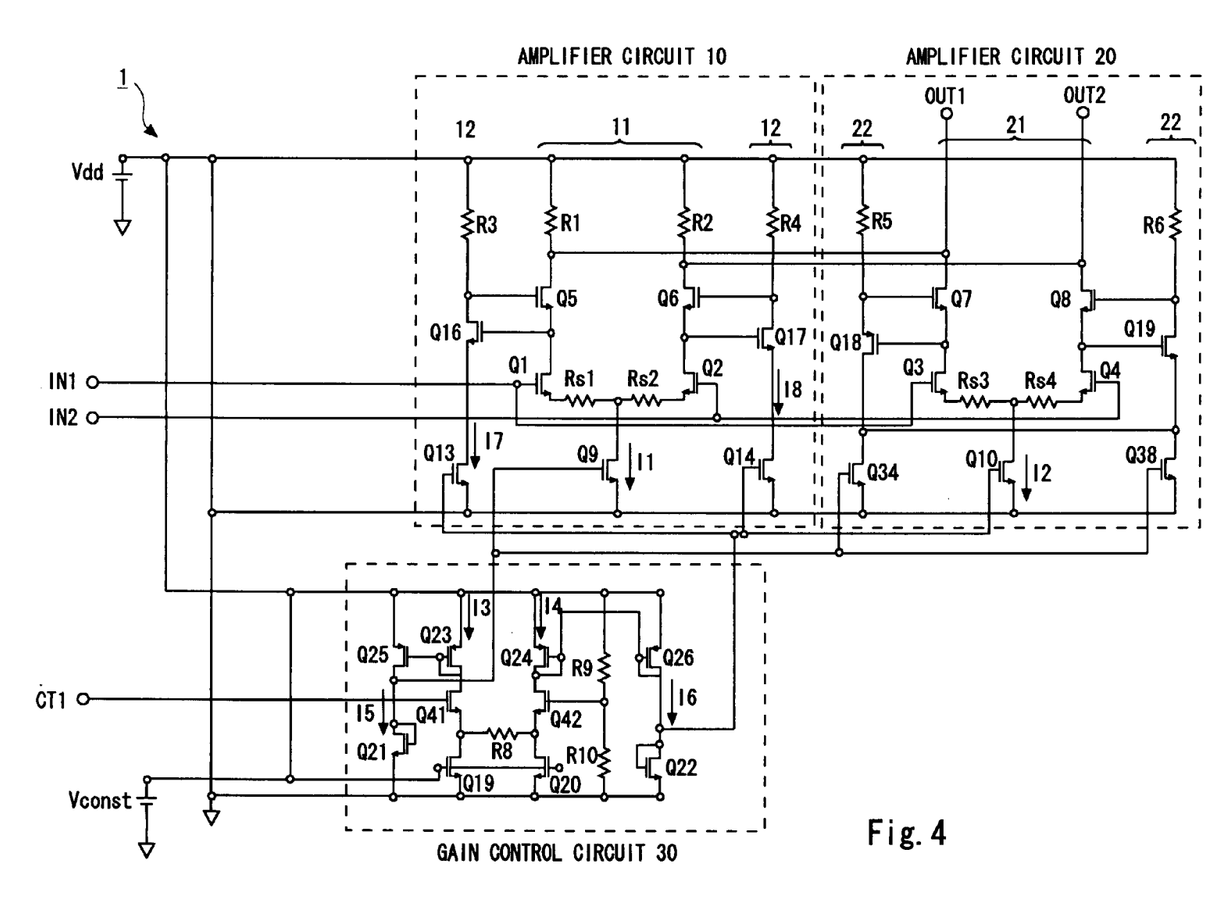
FIG. 4 is a circuit diagram showing the configuration of a gain variable amplifier according to a third embodiment of the present invention.

Next, a gain variable amplifier according to a third embodiment of the present invention is described. A feature of the gain variable amplifier of this embodiment resides in two differential amplifiers where drain potentials of differential input transistors are changed in accordance with the gain control.

FIG. 4 is a circuit diagram showing the configuration of the gain variable amplifier of this embodiment. The basic configuration of the gain variable amplifier 1 is the same as that of FIG. 3. In FIG. 4, the same components as those of FIG. 3 are denoted by like reference numerals, and their description is omitted if not necessary.

The gain variable amplifier 1 of this embodiment differs from that of FIG. 3 in that a control voltage of the gain control circuit 30 is applied to both of the bias circuits 12 and 22 of the amplifier circuits 10 and 20.

In this embodiment, the gates of the transistors Q9, Q34, and Q38 are commonly connected with the drain and gate of the transistor Q21. The gates of the transistors Q10, Q13, and Q14 are commonly connected with the drain and gate of the transistor Q22.

The bias circuit 22 of the first and second embodiments generates a constant bias voltage based on the constant potential Vconst, but the bias circuit 22 of this embodiment generates a variable bias voltage in accordance with the first control voltage from the gain control circuit 30 to supply the generated bias voltage to the transistors Q7 and Q8.

As mentioned above, in this embodiment, the bias voltage of both the amplifier circuits is controlled based on the gains to further improve the distortion characteristic. For example, if a difference in gain between the amplifier circuits 10 and 20 is set small, the distortion of the low-gain amplifier circuit 20 cannot be neglected. In such a case, even if the gain variable amplifier has a large gain, and the bias current I2 is reduced, the differential input transistors of the amplifier circuit 20 are controlled to operate in the triode region to improve the distortion characteristic. Incidentally, the above connection is applicable to the bias circuit 22 configured as shown in FIG. 1.

Other Embodiments

The above embodiments describe the example where the sum of the bias currents I1 and I2 is constant, but the present invention is not limited thereto and the sum of the bias currents I1 and I2 may vary. The aforementioned beneficial effects are exerted in such a structure that the distortion characteristic would deteriorate when the bias current I1 or I2 is reduced.

The above embodiments describe the gain variable amplifier having two differential amplifiers, but the present invention is not limited thereto and the amplifier may have two or more differential amplifiers.

The above embodiments describe the differential amplifier that amplifiers differential signals, but the present invention is not limited thereto and the amplifier may amplify only one input signal. For example, in the illustrated example, only the transistors Q1 and Q5 may be used as the amplifier circuits.

The circuit configuration of the above embodiments is given by way of example, and the other circuit configurations may be adopted insofar as the circuit can operate in a like manner. For example, transistors different in polarity may be used, and a bipolar transistor may be used in place of the MOSFET.

It is apparent that the present invention is not limited to the above embodiment that may be modified and changed without departing from the scope and spirit of the invention.

What is claimed is:

1. A gain variable amplifier, comprising:
a plurality of amplifier circuits connected to a common input terminal and a common output terminal; and
a gain control circuit,
wherein each of the plurality of amplifier circuits includes:
a first amplifying element connected to the input terminal;
a first cascoded element connected to the first amplifying element;
a variable current source connected to an amplifying element; and
a bias circuit connected to the first cascoded element.

2. The gain variable amplifier according to claim 1, wherein:
the first amplifying element comprises a first amplifying transistor,
the first cascoded element comprises a first cascoded transistor cascoded with the first amplifying transistor, and
a current-output-side terminal of the first amplifying transistor and a current-input-side terminal of the first cascoded transistor are connected mutually.

3. The gain variable amplifier according to claim 1, wherein:
a gain of each of the plurality of amplifier circuits is different and
the gain control circuit controls the gains of the amplifier circuits by controlling a current of the variable current source.

4. The gain variable amplifier according to claim 3, wherein the gain control circuit controls a sum current of the plurality of variable current sources included in the plurality of amplifier circuits respectively to be constant.

5. The gain variable amplifier according to claim 2, wherein the first bias circuit is connected to a control terminal of the first cascoded transistor.

6. The gain variable amplifier according to claim 5, wherein the first bias circuit included in at least one amplifier circuit is controlled to lower a potential at a node between the first amplifying transistor and the first cascoded transistor when the current from the variable current source is decreased by the gain control circuit.

7. The gain variable amplifier according to claim 1, wherein the plurality of amplifier circuits include a common load element connected to the first cascoded element.

8. The gain variable amplifier according to claim 2, wherein the amplifying circuit comprises a differential amplifier.

9. The gain variable amplifier according to claim 8, wherein each of the plurality of amplifier circuits further includes:
a second amplifying transistor forming a pair with the first amplifying transistor;
a second cascaded transistor forming a pair with the first cascoded transistor; and
a second bias circuit forming a pair with the first bias circuit.

10. The gain variable amplifier according to claim 1, wherein said first amplifying element of each of the plurality of amplifier circuits is biased so as to operate in a non-saturated region.

* * * * *